United States Patent
Gealow et al.

(10) Patent No.: US 6,624,772 B1
(45) Date of Patent: Sep. 23, 2003

(54) OFFSET CALIBRATION SYSTEM

(75) Inventors: Jeffrey C. Gealow, Andover, MA (US); Thomas J. Barber, Jr., Medford, MA (US); Paul F. Ferguson, Jr., North Andover, MA (US); Xavier S. Haurie, Arlington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/156,365

(22) Filed: May 28, 2002

(51) Int. Cl.[7] ............................................... H03M 1/10
(52) U.S. Cl. ...................... 341/120; 341/118; 341/143
(58) Field of Search ................................ 341/118, 120, 341/143

(56) References Cited

U.S. PATENT DOCUMENTS

| | | | | |
|---|---|---|---|---|
| 4,340,882 A | * | 7/1982 | Maio et al. ................ | 341/118 |
| 4,509,037 A | * | 4/1985 | Harris ........................ | 341/143 |
| 4,943,807 A | | 7/1990 | Early et al. | |
| 5,248,970 A | | 9/1993 | Sooch et al. | |
| 5,793,319 A | * | 8/1998 | Ard ............................ | 341/120 |
| 5,818,370 A | | 10/1998 | Sooch et al. | |
| 5,874,910 A | * | 2/1999 | Cooper ...................... | 341/143 |
| 5,905,453 A | * | 5/1999 | Kase .......................... | 341/143 |
| 5,977,894 A | * | 11/1999 | McCarroll et al. ........ | 341/120 |
| 5,982,313 A | * | 11/1999 | Brooks et al. ............. | 341/143 |
| 6,229,466 B1 | * | 5/2001 | Gattani ...................... | 341/120 |
| 6,281,818 B1 | * | 8/2001 | Miller ........................ | 341/120 |
| 6,323,800 B1 | * | 11/2001 | Chiang ...................... | 341/161 |
| 6,417,794 B1 | * | 7/2002 | Munoz et al. ............. | 341/161 |
| 6,424,276 B1 | * | 7/2002 | Munoz et al. ............. | 341/120 |
| 6,459,426 B1 | * | 10/2002 | Eglit et al. ................. | 345/213 |

* cited by examiner

*Primary Examiner*—Michael Tokar
*Assistant Examiner*—Linh Van Nguyen
(74) *Attorney, Agent, or Firm*—Iandiorio & Teska

(57) ABSTRACT

An offset calibration system includes an analog to digital converter having a first full-scale range with a first offset compensation circuit; a digital to analog converter having a second full-scale range with a second offset compensation circuit; the digital to analog converter having its output connected to the input of the analog to digital converter during calibration of the digital to analog converter; and a range adjustment circuit for accumulating a predetermined number of analog to digital output values and dividing the accumulated values by a preselected power of 2 in the ratio of the voltage corresponding to the analog to digital converter least significant bit to the voltage corresponding to the digital to analog converter least significant bit.

4 Claims, 5 Drawing Sheets

OFFSET CALIBRATION SYSTEM

FIELD OF THE INVENTION

This invention relates to an offset calibration system for an integrated analog to digital converter (ADC) and digital to analog converter (DAC) with full-scale ranges not related by a power of two.

BACKGROUND OF THE INVENTION

Analog to digital converters (ADCs) often have significant offset errors. That is, for a zero input there will not be a zero output. The difference is the offset. To compensate for the offset an ADC may be calibrated by introducing a zero input to the ADC to determine the offset, then subtracting the offset from the ADC output during normal operation to remove the error.

Digital to analog converters (DACs) also often have significant offset errors. When used together in a circuit with a calibrated ADC, a DAC may be calibrated to compensate for its offset. The DAC input is set to zero; its analog output represents the offset error and is fed to the input of the ADC. The output of the calibrated ADC is thus representative of the offset error of the DAC. During normal operation, the DAC offset, measured using the ADC, is subtracted from input codes. This approach has worked well. However, when the ADC and DAC least significant bits (LSBs) do not correspond to the same voltage, the offset error of the DAC measured using the ADC must be adjusted by the ratio of the LSB voltages to obtain the proper offset correction for the DAC. When the ADC and DAC full-scale ranges are equal or related by a power of two, the adjustment may be performed by shifting the ADC output (represented as a binary number) left or right. Shifting the ADC output left effectively multiplies the value by a power of two. Shifting the output right divides the value by a power of two. When the full-scale ranges are not related by a power of two, the adjustment may be accomplished by multiplication and division. However, multiplication and division by numbers that are not powers of two requires fairly large digital circuits.

BRIEF SUMMARY OF THE INVENTION

It is therefore an object of this invention to provide an improved offset calibration system.

It is a further object of this invention to provide such an improved offset calibration system for an analog to digital converter and digital to analog converter having full-scale ranges not related by a power of two.

It is a further object of this invention to provide such an improved offset calibration system which accommodates the differing ranges without employing a division by a number that is not a power of two.

It is a further object of this invention to provide such an improved offset calibration system which accommodates the differing ranges without employing a multiplication by a number that is not a power of two.

It is a further object of this invention to provide such an improved offset calibration system which can accomplish its calibration function primarily using circuits that are needed for normal operation such as accumulators used to implement the decimators for a delta-sigma ADC.

The invention results from the realization that a simple, effective offset calibration system for an integrated analog to digital converter and digital to analog converter with different ranges which avoids multiplication and division by numbers that are not powers of two can be achieved by accumulating a predetermined number of offset compensated analog to digital output values and dividing them by a preselected power of two in the ratio of the ADC LSB voltage to the DAC LSB voltage.

This invention features an offset calibration system including an analog to digital converter having a first full-scale range with a first offset compensation circuit and a digital to analog converter having a second full-scale range with a second offset compensation circuit. The digital to analog converter has its output connected to the input of the analog to digital converter during calibration of the digital to analog converter. A range adjustment circuit accumulates a predetermined number of analog to digital output values and divides the accumulated values by a preselected power of 2 in the ratio of the voltage corresponding to the analog to digital converter least significant bit to the voltage corresponding to the digital to analog converter least significant bit.

In a preferred embodiment the range adjustment circuit may include an accumulator circuit for accumulating the predetermined number of analog to digital output values. The accumulator circuit may include a control circuit for determining the number of analog to digital output values to be accumulated. The accumulator circuit may include a register and means for selecting the stages of the register representing the quotient of the division of the accumulated values by the preselected power of 2. The analog to digital converter may be calibrated before the digital to analog converter is calibrated. The accumulator circuit may operate as digital filter during normal operation.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
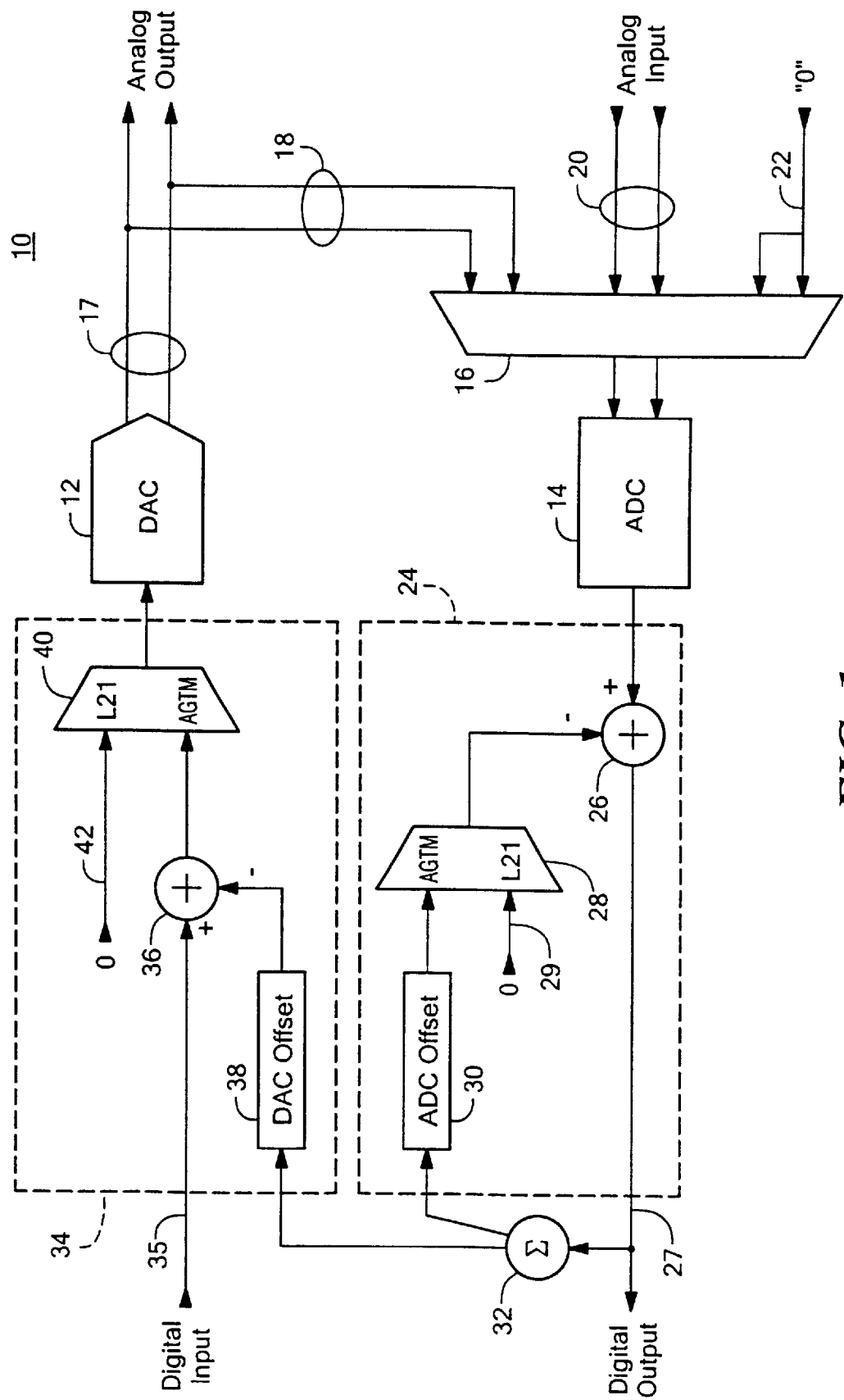
FIG. 1 is a schematic block diagram of an offset calibration system according to this invention.

There is shown in FIG. 1 an offset calibration system 10 according to this invention for calibrating a digital to analog converter (DAC) 12 and an analog to digital converter (ADC) 14 when the ADC and DAC full-scale ranges are not related by a power of two. ADC 14 is provided its inputs by a multiplexer 16 which can select from the output 17 of DAC 12, a normal analog input 20, or the zero input 22 (for offset calibration). At the output of ADC 14 is ADC offset compensation circuit 24 which includes an adder 26 that receives the output from ADC 14 and the output from multiplexer 28. A register 30 is used to store the ADC offset which is determined by the offset compensation circuit 24. Register 30 provides the ADC offset to one input of multiplexer 28; the other input 29 to multiplexer 28 is the zero code for calibration mode. A range adjustment circuit 32 according to this invention is interconnected between the digital output from adder 26 and the input to the DAC offset compensation circuit 34 associated with DAC 12. Offset compensation circuit 34 also includes an adder 36 and a register 38 for storing the DAC offset. Adder 36 receives one input from register 38, the other is the digital input on line 35. Adder 36 provides one input to multiplexer 40; the other input is the zero input 42 used for calibration. The output of multiplexer 40 is delivered to the input of DAC 12.

Figure 2:
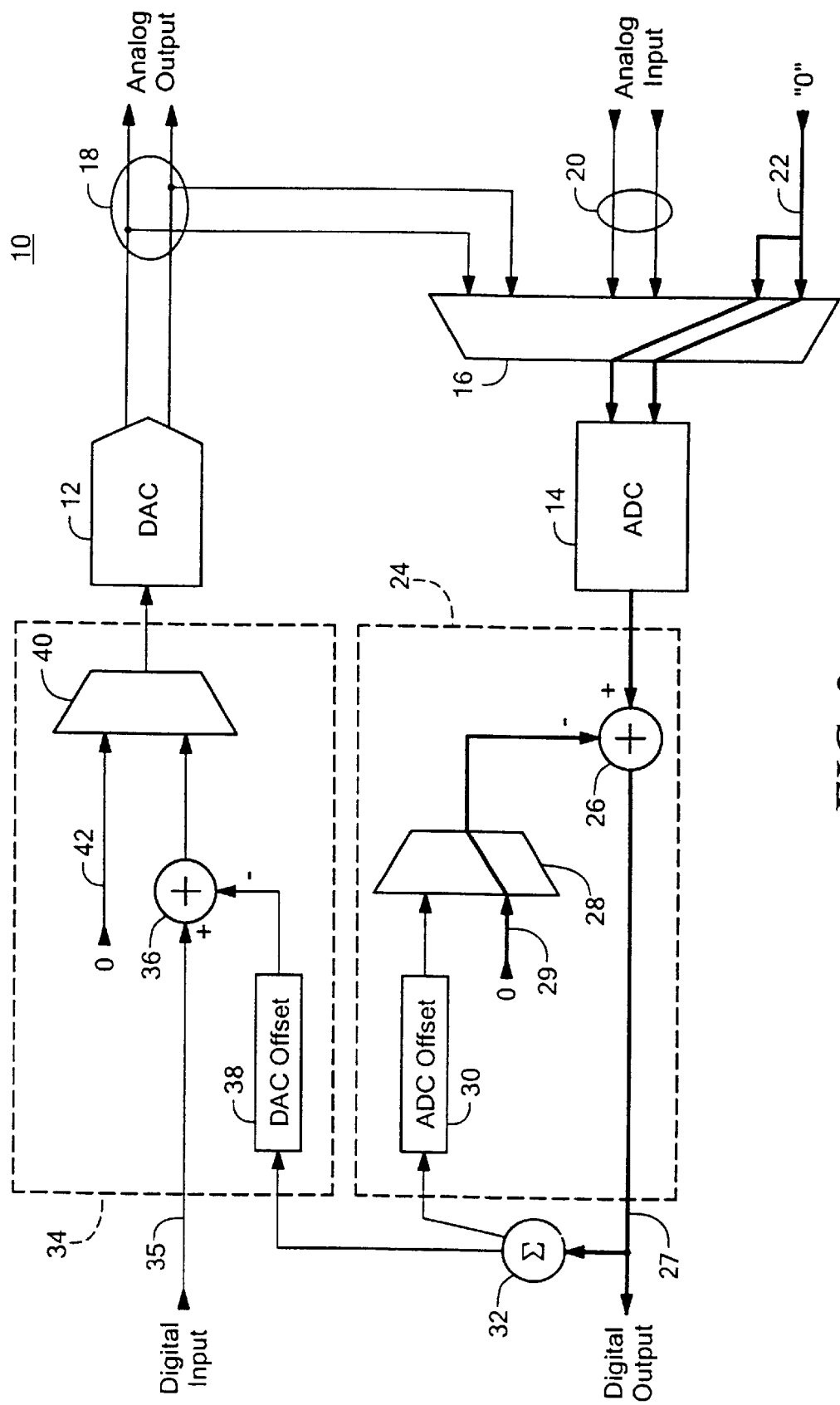
FIGS. 2, 3 and 4 are views similar to FIG. 1 showing the signal path for calibration of the analog to digital converter, calibration of the digital to analog converter, and in normal operation, respectively.

Before normal operation begins, and before DAC calibration, ADC 14 is calibrated as shown in FIG. 2 by applying a zero input from line 22 to its differential input. Any signal other than zero at the output of ADC 14 is fed through adder 26, to range adjustment circuit 32. The zero input on line 29 to multiplexer 28 is selected so that zero is fed into the negative input of adder 26. Thus, the output of adder 26 represents the ADC offset. The output of adder 26 is delivered through range adjustment circuit 32 to offset compensation circuit 24. The value stored in ADC offset register 30 is the offset error produced by ADC 14. During normal operation, the value stored in ADC offset register 30 will be directed through multiplexer 28 into adder 26 where it will be subtracted from to the output of ADC 14 to remove the offset error. During the ADC calibration in FIG. 2, the DAC circuit is not activated.

Figure 3:
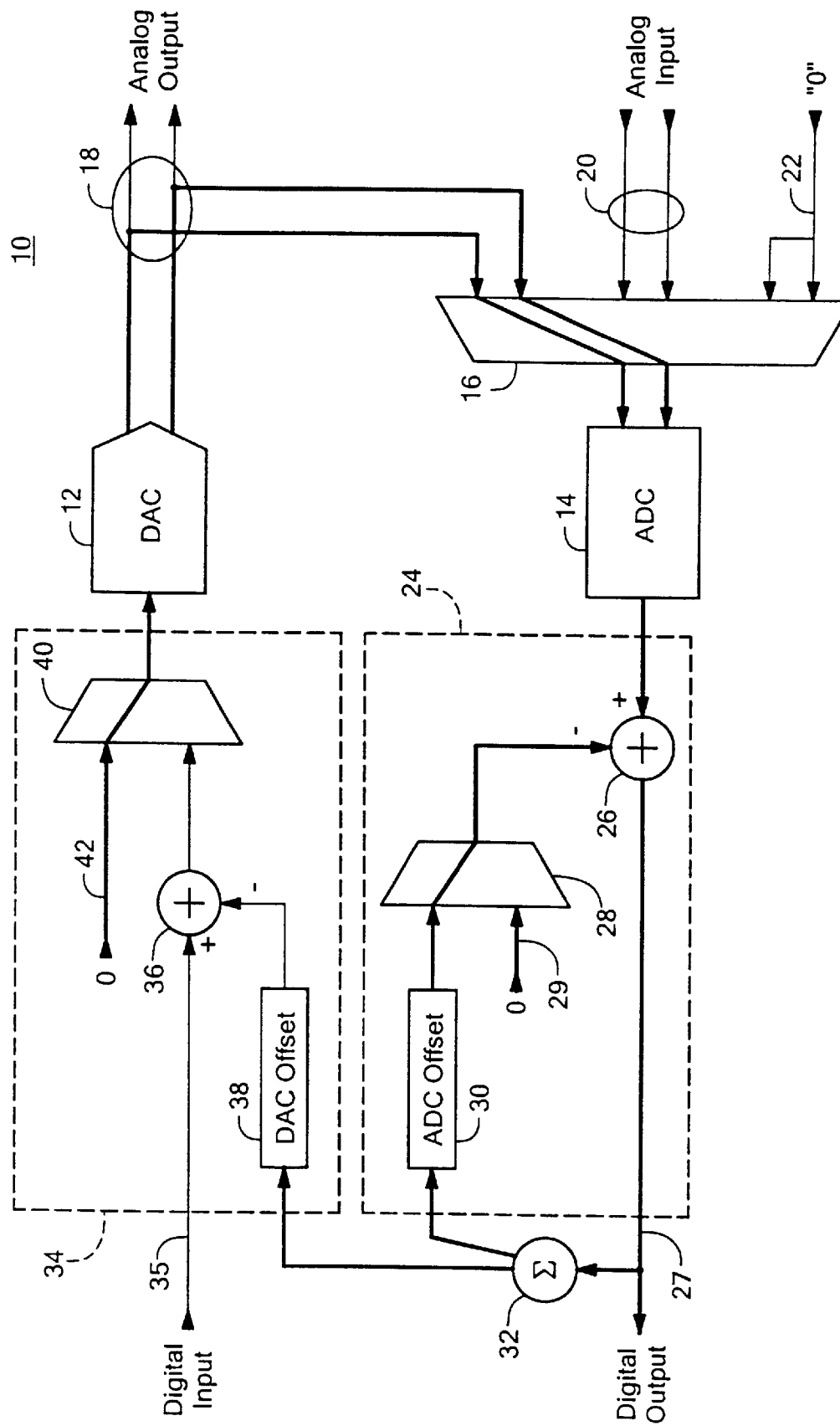

During calibration of DAC 12, FIG. 3, a zero input on line 42 through multiplexer 40 is delivered to DAC 12. The output of DAC 12, which ideally is zero but is typically some offset error value, is delivered on line 18 through multiplexer 16 to the input of ADC 14. The output of ADC 14 now is offset compensated by subtraction of the value in ADC offset register 30 delivered through multiplexer 28 to adder 26. The output 27 is delivered through range adjustment circuit 32 to offset compensation circuit 34 of DAC 12. Here whatever offset has occurred will be stored in DAC offset register 38 and in the future will be applied to adder 36 to subtract from the digital input to compensate for the offset of DAC 12.

Figure 4:
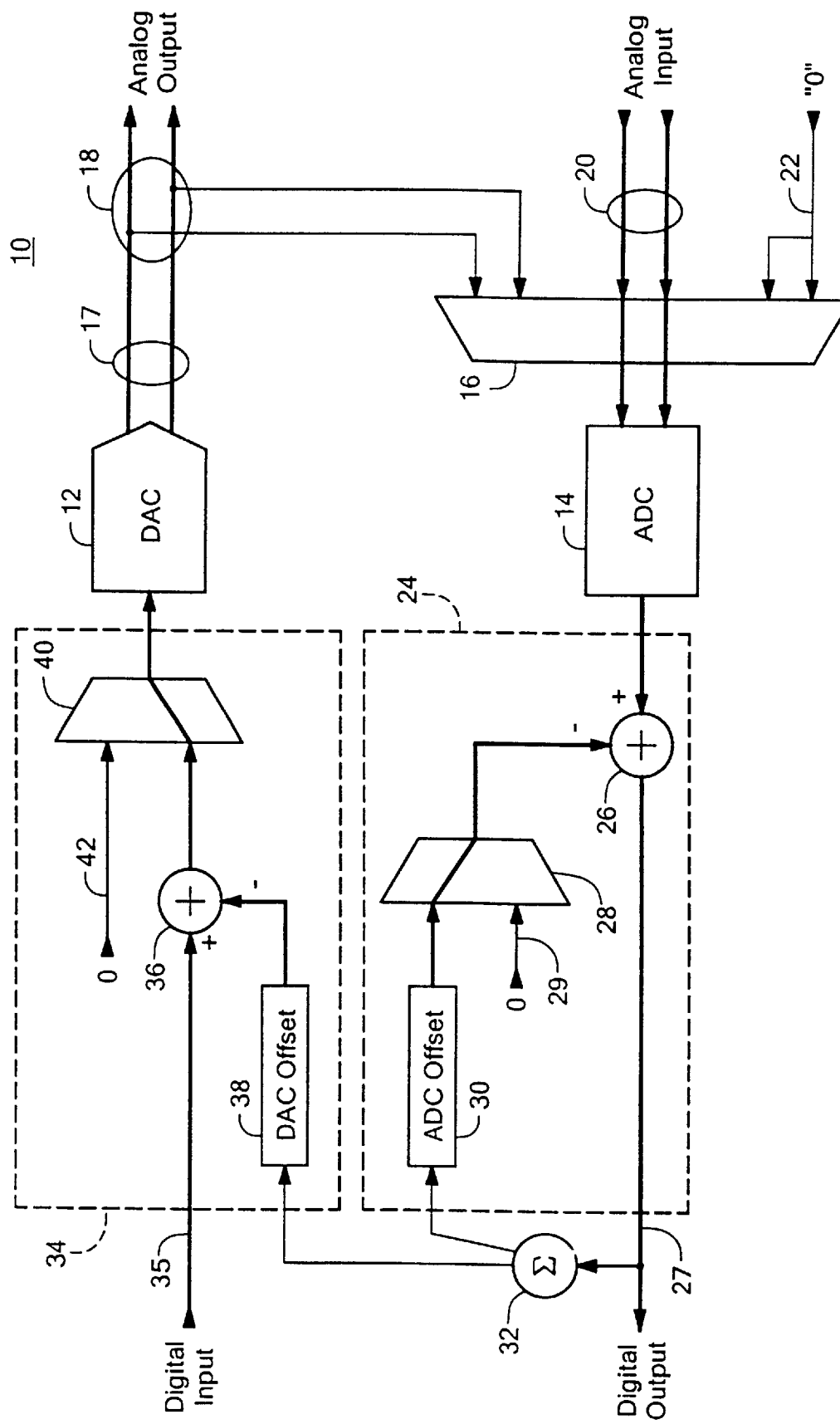

In normal operation, FIG. 4, the analog input on lines 20 to multiplexer 16 is delivered to ADC 14. The output from ADC 14 is compensated by offset compensation circuit 24. This is done by the ADC offset stored in register 30 being delivered through multiplexer 28 to adder 26 where it is subtracted from the output of ADC 14 to remove the ADC offset error. With digital input 35 provided to offset compensation circuit 34, adder 36 subtracts the DAC offset stored in register 38 from the digital input signal on line 35 and provides an anticipatory correction to the signal delivered to DAC 12 through multiplexer 40 so that the DAC offset error is compensated and the output on lines 17 is without offset error.

In accordance with this invention, the range adjustment circuit 32 is employed to introduce the necessary factor so that the offset compensation is accurately accomplished even though DAC 12 and ADC 14 have full-scale ranges that are not related by a power of two.

Figure 5:
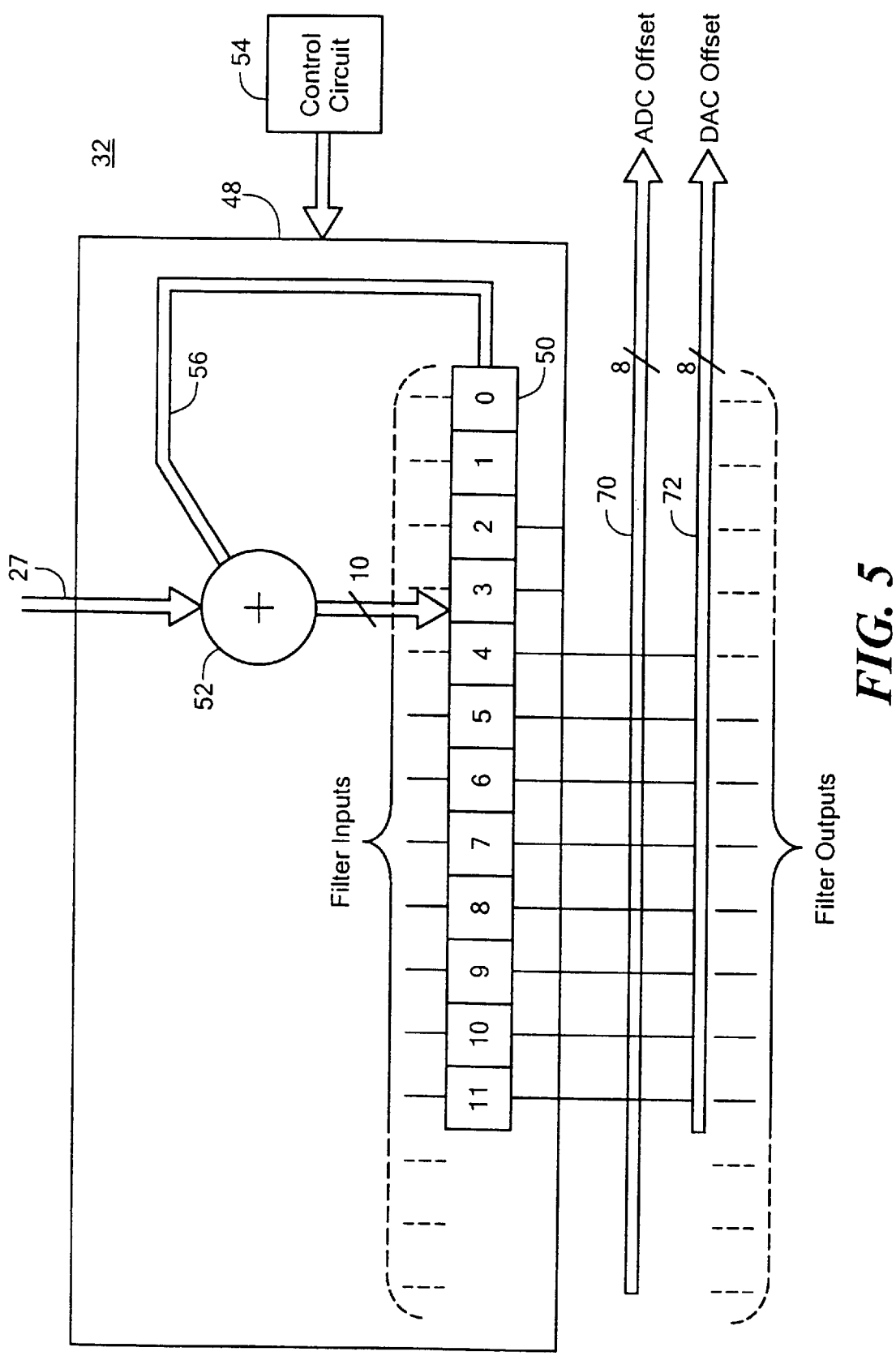
FIG. 5 is a schematic diagram of one construction of the range adjustment circuit of FIG. 1 according to this invention.

Range adjustment circuit 32 is shown in more detail in FIG. 5 as including an accumulator 48 having an accumulation register 50 and adder 52. Accumulator 48 and accumulator register 50 act as a filter in normal operation. Control circuit 54 determines how many output values from ADC 14 will be accumulated in register 50. The output lines 70 and 72 are the means for selecting the stages of the register representing the quotient of the division of the accumulated values by the preselected power of 2. For example, if the DAC 12 has an output range of ±1 volt and ADC 14 has a range of ±1.2 volts, there is an obvious mismatch between the ranges that will affect the accuracy of the DAC offset error compensation. Therefore, to adjust for this and to do so without using explicit multiplication or division by a number that is not a power of 2, a number of successive output values from ADC 14 will be accumulated in register 50 through the use of adder 52 which receives an input on line 27 from ADC 14 through adder 26 and an input on line 56 from register 50. The number of values to be accumulated is designated M. In that case $$M = \frac{ADCrange/2^A}{DACrange/2^D} * (2^n) \qquad (1)$$

where the ADCrange is the ADC full-scale range, A is the resolution of the ADC (number of bits), DACrange is the DAC full-scale range, D is the resolution of the DAC (number of bits), and $2^n$ represents some preselected power of 2 chosen for convenience.

Thus, for an 8-bit ADC, an 8-bit DAC, and n=4

$$M = \frac{1.2 \text{ volts}/128}{1.0 \text{ volts}/128}(16) = 19.2 \qquad (2)$$

Rounding the 19.2 to simply 19, then the number of output values from ADC 14 to be accumulated in register 50 is 19. By increasing the number of values accumulated the accuracy could be improved. But in doing so the delay of accumulating the additional values is introduced. During the ADC offset calibration, sixteen values are accumulated in register 50 which is a twelve-bit register. The bits 0–3 are ignored and the bits 4–11 represent the ADC offset. When the DAC offset calibration is performed nineteen values are accumulated in register 50. Bits 0–3 are ignored and bits 4–11 represent the DAC offset. The difference between the full-scale ranges, 1.2 volts and 1 volt, is compensated for by the difference in the accumulation cycles, nineteen and sixteen. The ratio of the ADC range to the DAC range is approximately equal or may be made almost exactly equal to the ratio of the number of accumulations for the ADC, M, to the number represented by $2^n$. The number of output values accumulated in register 50 is determined by control circuit 54. In this case it designates sixteen for the ADC cycle and nineteen for the DAC cycle. ADC 14 is a delta-sigma ADC comprising a modulator and a digital filter. The digital filter implementation requires an accumulator. The logic used to implement the accumulator for the digital filter is also used to implement the range adjustment circuit.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. An offset calibration system comprising:
   an analog to digital converter having a first full-scale range with a first offset compensation circuit;
   a digital to analog converter having a second full-scale range with a second offset compensation circuit; said digital to analog converter having its output connected to the input of said analog to digital converter during offset calibration of said digital to analog converter; and a range adjustment circuit for accumulating a predetermined number of analog to digital output values and dividing the accumulated values by a preselected power of two in the ratio of the voltage corresponding to the analog to digital converter least significant bit and the voltage corresponding to the digital to analog converter least significant bit.

2. The offset calibration system of claim 1 in which said range adjustment circuit includes an accumulator circuit for accommodating said predetermined number of analog to digital output values.

3. The offset calibration system of claim 2 in which said accumulator circuit includes a control circuit for determining the number of analog to digital output values to be accumulated.

4. The offset calibration system of claim 2 in which said accumulator circuit includes a register and means for selecting the stages of the register representing the quotient of the division of the accumulated values by said preselected power of two.

* * * * *